United States Patent
Wu et al.

(10) Patent No.: US 9,870,942 B1
(45) Date of Patent: Jan. 16, 2018

(54) METHOD OF FORMING MANDREL AND NON-MANDREL METAL LINES HAVING VARIABLE WIDTHS

(71) Applicant: GLOBALFOUNDRIES Inc., Grand Cayman (KY)

(72) Inventors: Xusheng Wu, Ballston Lake, NY (US); Ziyan Xu, Fishkill, NY (US); Chengwen Pei, Danbury, CT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/410,032

(22) Filed: Jan. 19, 2017

(51) Int. Cl.
*H01L 21/308* (2006.01)
*H01L 21/033* (2006.01)
(Continued)

(52) U.S. Cl.
CPC .... *H01L 21/76816* (2013.01); *H01L 21/0337* (2013.01); *H01L 21/0338* (2013.01);
(Continued)

(58) Field of Classification Search
CPC ............. H01L 21/0337; H01L 21/3086; H01L 21/31144; H01L 21/0338; H01L 21/76816
See application file for complete search history.

(56) References Cited

U.S. PATENT DOCUMENTS 9,099,531 B1 * 8/2015 Cheng ................. H01L 21/0338
2007/0284669 A1 * 12/2007 Abadeer ................ B07C 5/344
257/368

(Continued)

*Primary Examiner* — Marvin Payen
*Assistant Examiner* — Jeremy Joy
(74) *Attorney, Agent, or Firm* — Heslin Rothenberg Farley & Mesiti P.C.

(57) ABSTRACT

A method includes providing a semiconductor structure having a silicon mandrel layer, a hardmask stack and a dielectric layer. A $1^{st}$ portion and a $2^{nd}$ portion of the mandrel layer are doped with a $1^{st}$ concentration and a $2^{nd}$ greater concentration of dopant respectively. $1^{st}$ and $2^{nd}$ mandrels are patterned into the $1^{st}$ and $2^{nd}$ portions of the mandrel layer respectively. The $1^{st}$ and $2^{nd}$ mandrels are oxidized in the same thermal oxidation process to form $1^{st}$ oxidation spacers on sidewalls of the $1^{st}$ mandrels and $2^{nd}$ oxidation spacers on sidewalls of the $2^{nd}$ mandrels. The $2^{nd}$ oxidation spacers have a thickness that is greater than a thickness of the $1^{st}$ oxidation spacers. The $1^{st}$ and $2^{nd}$ oxidation spacers are utilized to form $1^{st}$ and $2^{nd}$ metal lines respectively in the dielectric layer. The $1^{st}$ and $2^{nd}$ metal lines have a different thickness.

20 Claims, 8 Drawing Sheets

(51) Int. Cl.
*H01L 21/311* (2006.01)
*H01L 21/768* (2006.01)
*H01L 21/3115* (2006.01)
*H01L 23/528* (2006.01)

(52) U.S. Cl.
CPC .... *H01L 21/3086* (2013.01); *H01L 21/31111* (2013.01); *H01L 21/31144* (2013.01); *H01L 21/31155* (2013.01); *H01L 23/5283* (2013.01)

(56) References Cited

U.S. PATENT DOCUMENTS

| | | | |
|---|---|---|---|
| 2011/0021010 A1* | 1/2011 | Cheng | H01L 21/2236 438/513 |
| 2012/0235247 A1* | 9/2012 | Cai | H01L 21/3086 257/392 |
| 2013/0089984 A1* | 4/2013 | Raghunathan | H01L 21/0337 438/696 |
| 2014/0273363 A1* | 9/2014 | Chiu | H01L 21/3086 438/165 |
| 2014/0273441 A1* | 9/2014 | Kim | H01L 21/283 438/666 |
| 2015/0200107 A1* | 7/2015 | Cheng | H01L 21/3086 438/700 |
| 2015/0318181 A1* | 11/2015 | Cantone | H01L 21/82343 438/702 |
| 2016/0307844 A1* | 10/2016 | Oh | H01L 24/06 |

\* cited by examiner

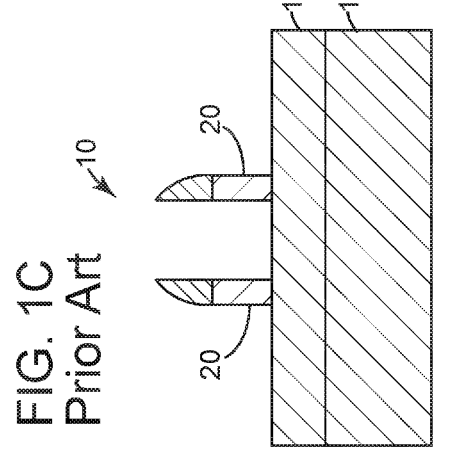
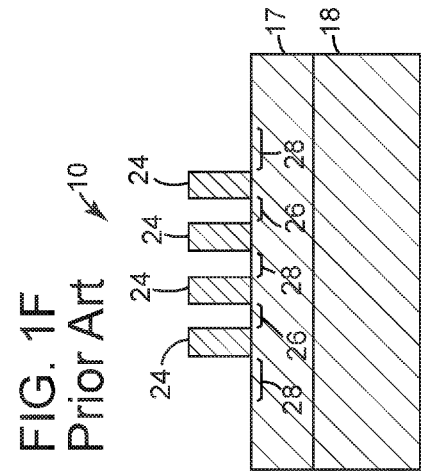
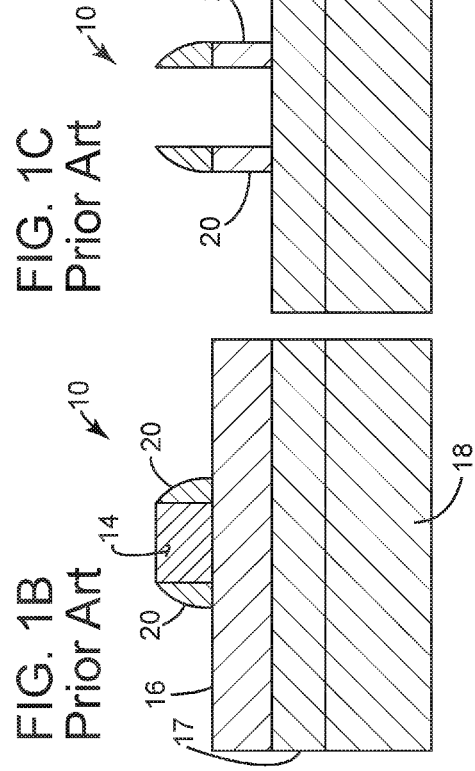
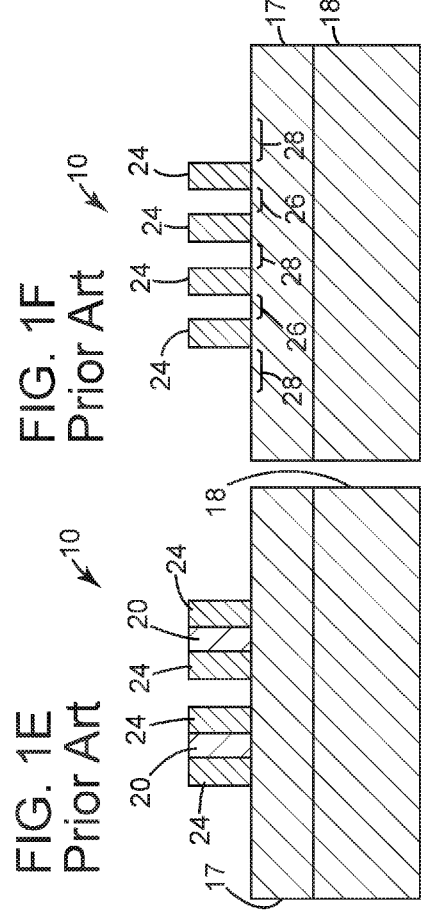
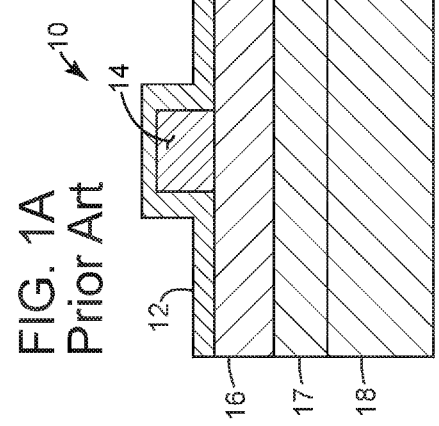
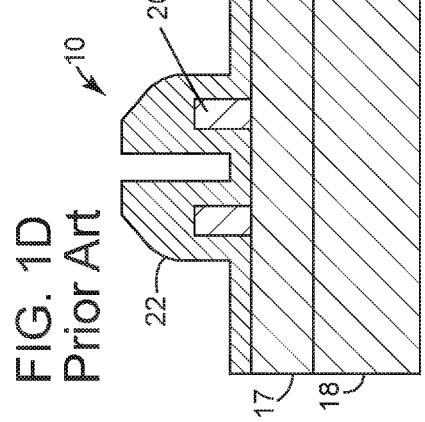

METHOD OF FORMING MANDREL AND NON-MANDREL METAL LINES HAVING VARIABLE WIDTHS

TECHNICAL FIELD

The present invention relates to semiconductor devices and methods of fabricating the same. More specifically, the invention relates to a method of forming interconnection metal lines having variable line widths for a semiconductor structure.

BACKGROUND

Self-aligned multiple patterning (SAMP) techniques (such as self-aligned double patterning (SADP) or self-aligned quadruple patterning (SAQP)) are currently used in ultra-high density integrated circuits to provide an electrical interconnection system which includes multiple arrays of parallel metal lines disposed in several levels of dielectric layers within a semiconductor structure. The dielectric layers are typically interconnected through a system of metalized vias.

In such SAMP techniques, the metal lines are typically formed from a series of self-aligned mandrel spacers disposed on sidewalls of parallel mandrels within the semiconductor structure. During the process flow, the mandrels are pulled to form a pattern from the remaining self-aligned mandrel spacers. The pattern is then transferred down into the underlying layers of the semiconductor structure to ultimately form alternating parallel mandrel and non-mandrel metal lines in a dielectric layer.

In an SADP technique, this basic process is performed once during the formation of the metal lines, such that the pitch of the metal lines is half the pitch of the mandrels. In an SAQP technique, this basic process is performed twice during the formation of the metal lines, such that the pitch of the metal lines is a quarter the pitch of the mandrels.

However, formation of interconnect systems having large arrays of multiple parallel mandrel and non-mandrel metal lines in a Back-End-Of-Line (BEOL) process flow for a semiconductor fabrication often require the metal lines to have variable line widths. This kind of variability in line width is very difficult to achieve with a conventional SAMP process. This is particularly the case when the technology is in the 7 nanometer (nm) technology class and beyond or when the minimum pitch (i.e., the minimum distance between repetitive features in a semiconductor device structure) is less than or equal to 40 nm.

Moreover, the problem is exacerbated even further when the line widths and the variations in line widths are too small for conventional lithographic process to resolve. More specifically, a typical SAMP process can print small constant width metal lines, such as an array of 20 nm constant width metal lines. A typical lithographic process can print large variable width metal lines, such as an array of metal lines having widths of 80 nm and 100 nm. However, variable width metal lines having widths (e.g., below 40 nm width) that are too small for a lithographic process to resolve are difficult to achieve with either an SAMP or a lithographic process.

Accordingly, there is a need for a method of forming mandrel and non-mandrel metal lines that have variable line widths. Moreover, there is a need for forming such variable line widths when the widths of the metal lines are below the resolution of a conventional lithographic process.

BRIEF DESCRIPTION

The present invention offers advantages and alternatives over the prior art by providing a method of forming mandrel and non-mandrel metal lines having variable widths. The method can form metal lines having small variations relative to the overall average line width of the metal lines. The method is applicable to metal lines having a metal line pitch of 40 nm or less.

A method in accordance with one or more aspects of the present invention includes providing a semiconductor structure having a silicon mandrel layer and a hardmask stack disposed respectively over a dielectric layer. A 1st portion of the mandrel layer is doped with a 1st concentration of dopant. A 2nd portion of the mandrel layer is doped with a 2nd concentration of dopant. The 2nd concentration of dopant is greater than the 1st concentration of dopant. A set of 1st mandrels is patterned into the 1st portion of the mandrel layer. A set of 2nd mandrels is patterned into the 2nd portion of the mandrel layer. The 1st and 2nd mandrels are thermally oxidized in the same thermal oxidation process to form 1st oxidation spacers on sidewalls of the 1st mandrels and 2nd oxidation spacers on sidewalls of the 2nd mandrels. The 2nd oxidation spacers have a thickness that is greater than a thickness of the 1st oxidation spacers. The 1st and 2nd oxidation spacers are utilized to form 1st and 2nd metal lines respectively in the dielectric layer. The 1st metal lines have a thickness that is different than a thickness of the 2nd metal lines.

Another method in accordance with one or more aspects of the present invention includes providing a semiconductor structure having a silicon mandrel layer and a hardmask stack disposed respectively over a dielectric layer. A 1st portion of the mandrel layer is doped with a 1st concentration of dopant. A 2nd portion of the mandrel layer is doped with a 2nd concentration of the same dopant. The 2nd concentration of dopant is greater than the 1st concentration of dopant. A set of 1st mandrels is patterned into the 1st portion of the mandrel layer. A set of 2nd mandrels is patterned into the 2nd portion of the mandrel layer. The 1st and 2nd mandrels are thermally oxidized in the same thermal oxidation process to form 1st oxidation spacers on sidewalls of the 1st mandrels and 2nd oxidation spacers on sidewalls of the 2nd mandrels. The 2nd oxidation spacers have a thickness that is greater than a thickness of the 1st oxidation spacers. The 1st and 2nd oxidation spacers are utilized to form 1st and 2nd metal lines respectively in the dielectric layer. The 1st metal lines have a thickness that is greater than a thickness of the 2nd metal lines.

DRAWINGS

The invention will be more fully understood from the following detailed description taken in conjunction with the accompanying drawings, in which:

FIG. 1A is a side view of an exemplary embodiment of a prior art SAQP method of manufacturing a semiconductor structure in an intermediate stage of manufacture, the structure having a first spacer layer conformally disposed over an array of lithographically patterned mandrels;

FIG. 1B is a side view of prior art FIG. 1A with first spacers formed on sidewalls of the mandrels;

FIG. 1C is a side view of prior art FIG. 1B with the mandrel removed;

FIG. 1D is a side view of prior art FIG. 1C with a second spacer layer conformally coating the first spacers;

FIG. 1E is a side view of prior art FIG. 1D with second spacers formed on sidewalls of the first spacers, the first spacers functioning as an effective set of second mandrels;

FIG. 1F is a side view of prior art FIG. 1E with the first spacers removed;

Figure 6:
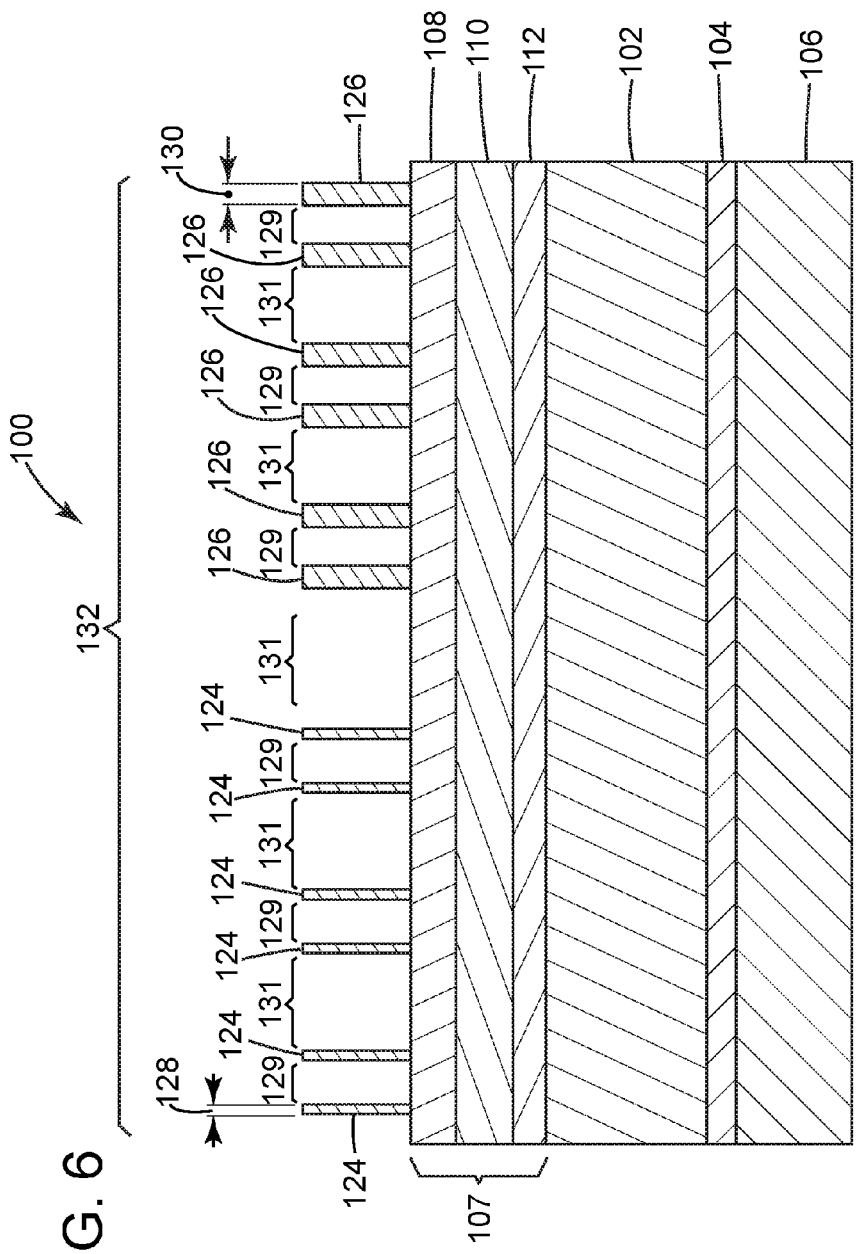
FIG. 6 is cross-sectional view of the structure of FIG. 5 after the 1st and 2nd mandrels have been pulled to form a metal line patter from the remaining 1st and 2nd spacers in accordance with the present invention.
Figure 7:
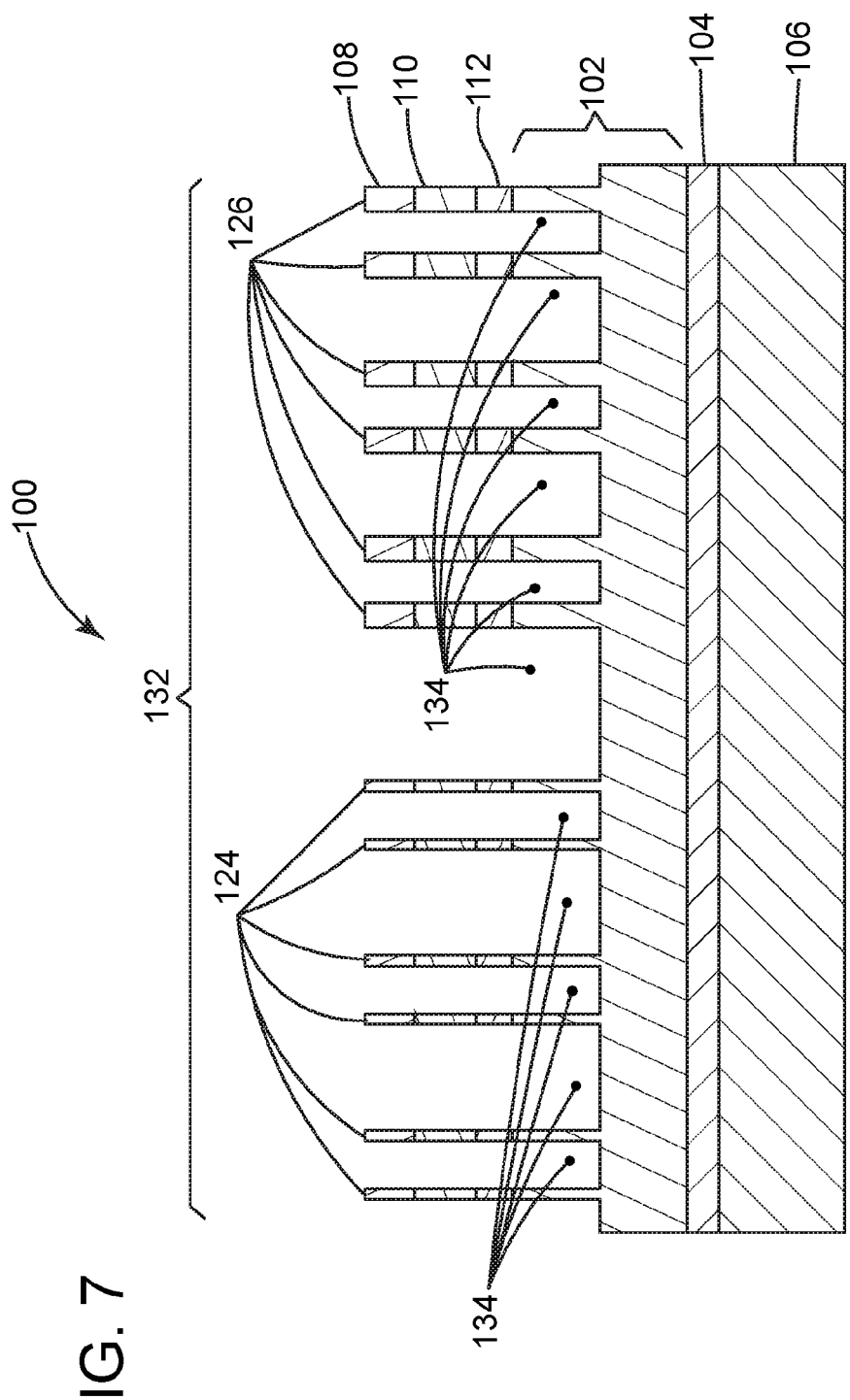
Figure 8:
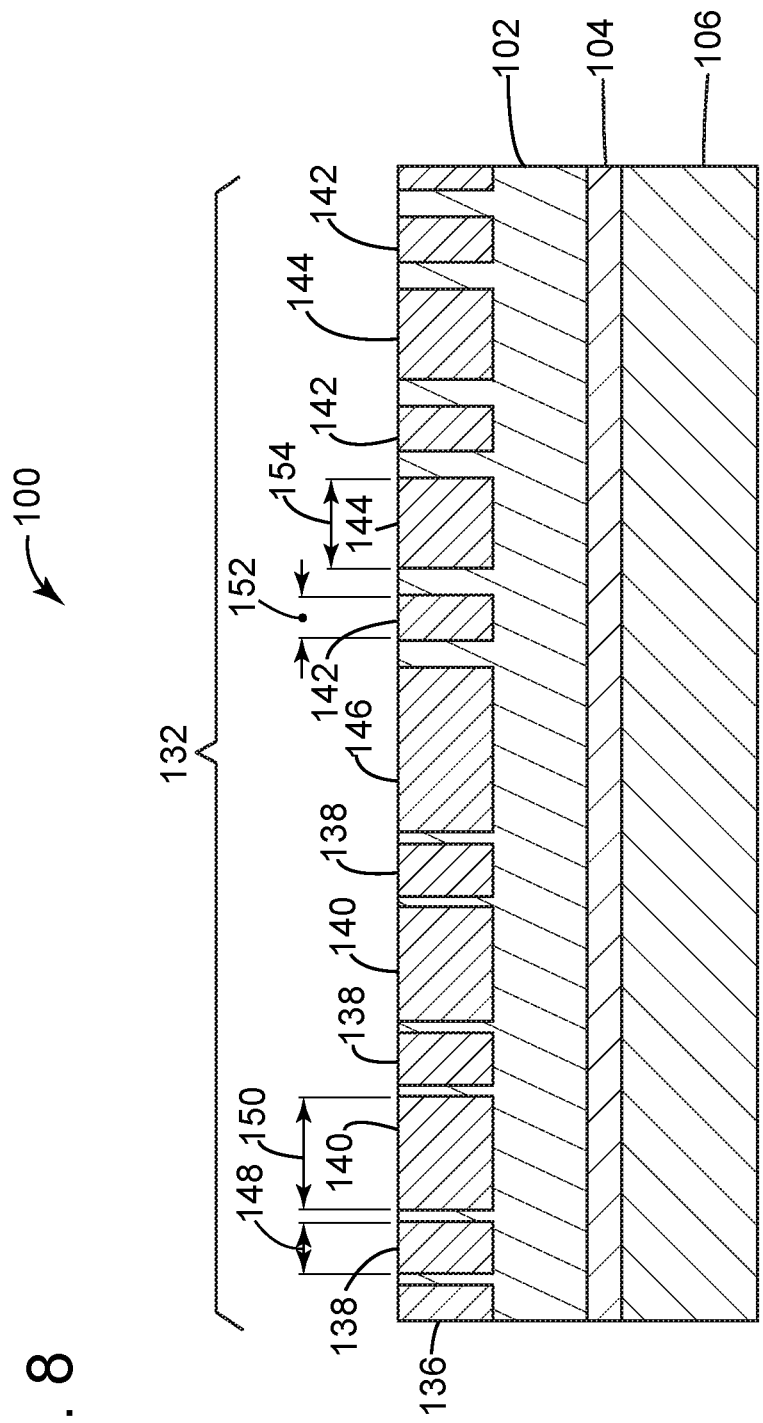

FIG. 7 is cross-sectional view of the structure of FIG. 6 after the pattern has been transferred through the hardmask stack and into the dielectric layer to form trenches within the dielectric layer in accordance with the present invention; and FIG. 8 is cross-sectional view of the structure of FIG. 7 after a metal layer has been disposed over the structure to fill the trenches and planarized to complete the formation of 1st and 2nd mandrel and non-mandrel metal lines, wherein the 1st and 2nd metal lines have different widths (or thicknesses) in accordance with the present invention.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

FIGS. 1A-1F illustrate a typical prior art SAMP method of forming metal lines in a dielectric layer of a semiconductor fabrication. More specifically, they illustrate a typical SAQP process.

Referring to FIG. 1A, a structure 10, in an intermediate stage of manufacture, has a first spacer layer 12 conformally disposed over an array of lithographically patterned first mandrels 14 having a predetermined constant width and pitch. The first spacer layer 12 is typically disposed over the mandrels 14 using an atomic layer deposition (ALD) process. In this exemplary embodiment, the mandrels are disposed over a stack of a first hardmask layer 16 and a second hardmask layer 17. The two hardmask layers 16 and 17 are disposed over a dielectric layer 18.

Referring to FIG. 1B, the first spacer layer 12 is then anisotropically etched to form a first array of first spacers 20 on the sidewalls of the mandrels 14. Referring to FIG. 1C, the mandrels 14 are then removed and the first array of spacers 20 are anisotropically etched into the first hardmask layer 16. Up to this point, the process flow has been that of a typical SADP process. Since there are two spacers 20 for each mandrel 14, the line density has doubled and the pitch cut in half.

Starting with FIG. 1D, the first part of the SAQP process flow is repeated over the first array of spacers 20. That is, a second spacer layer 22 is disposed over the first array of spacers 20 typically using a second ALD process. As such, the first spacers 20 now function effectively as a set of second mandrels for the second half of the SAQP process.

Referring to FIG. 1E, the second spacer layer 22 is next anisotropically etched to form an array of second spacers 24 that are self-aligned on the sidewalls of the first spacers 20. Finally, referring to FIG. 1F, the first spacers 20 are then removed, leaving only the second spacers 24, which form a metal line pattern on the top of the second hardmask layer 17. The pattern will then be etched through the second hardmask layer 17 and into the dielectric layer 18 to form trenches (not shown) into the dielectric layer 18. The trenches will later be metalized to form an array of mandrel and non-mandrel metal lines (not shown) in the dielectric layer 18. Since there are now four spacers 24 for each mandrel 14, the line density has quadrupled and the pitch has been quartered from that of the original mandrels 14.

The second spacers 24 of the pattern function as masks that will form dielectric filled spaces between the mandrel and non-mandrel metal lines within the dielectric layer 18. The exposed mandrel regions 26 over the second hardmask layer 17 where the first spacers 20 were disposed function as mandrel line molds in the formation of the mandrel metal lines within the dielectric layer 18. The exposed non-mandrel regions 28 over the second hardmask layer 17 that were not covered by either the first spacers 20 or second spacers 24 function as non-mandrel line molds in the formation of the non-mandrel metal lines within the dielectric layer 18.

It is important to note that, due to the nature of the ALD processes, the thickness of the spacer layers 12 and 22, and therefore the thickness of the spacers 20 and 24, can be very precisely controlled (e.g., plus or minus 2 nm) but there is very little flexibility in variations of that thickness. Accordingly, for all practical purposes, the spacers will have precisely the same thickness. As a result, the widths of the mandrel and non-mandrel metal lines that are controlled by the mandrels 14 and spacers 20, 24 are difficult to make variable using these prior art processes.

FIGS. 2-8 illustrate a method of forming variable width mandrel and non-mandrel metal lines in accordance with the present invention. By comparison to the prior art method of FIGS. 1A-1F, the method in accordance with the present invention does not utilize an ALD process to dispose a spacer layer over the structure 100 and then anisotropically etch that spacer layer to form spacers, which necessarily have to be of equal thickness throughout (like prior art spacers 20 and 24).

Rather, the method of FIGS. 2-8 takes advantage of the fact that silicon, such as a polycrystalline silicon, an amorphous silicon (aSi) or similar, with different concentrations of dopants will have different oxidation rates when subjected to the same thermal oxidation process. As will be explained in greater detail herein, these different oxidation rates can be utilized to form self-aligned spacers on sidewalls of mandrels that have different thicknesses. These spacers with variable thicknesses can then be used to form mandrel and non-mandrel metal lines with variable widths in a semiconductor structure. Advantageously, these spacers can form variable width metal lines well below the resolution of a convention lithography process.

Figure 2:
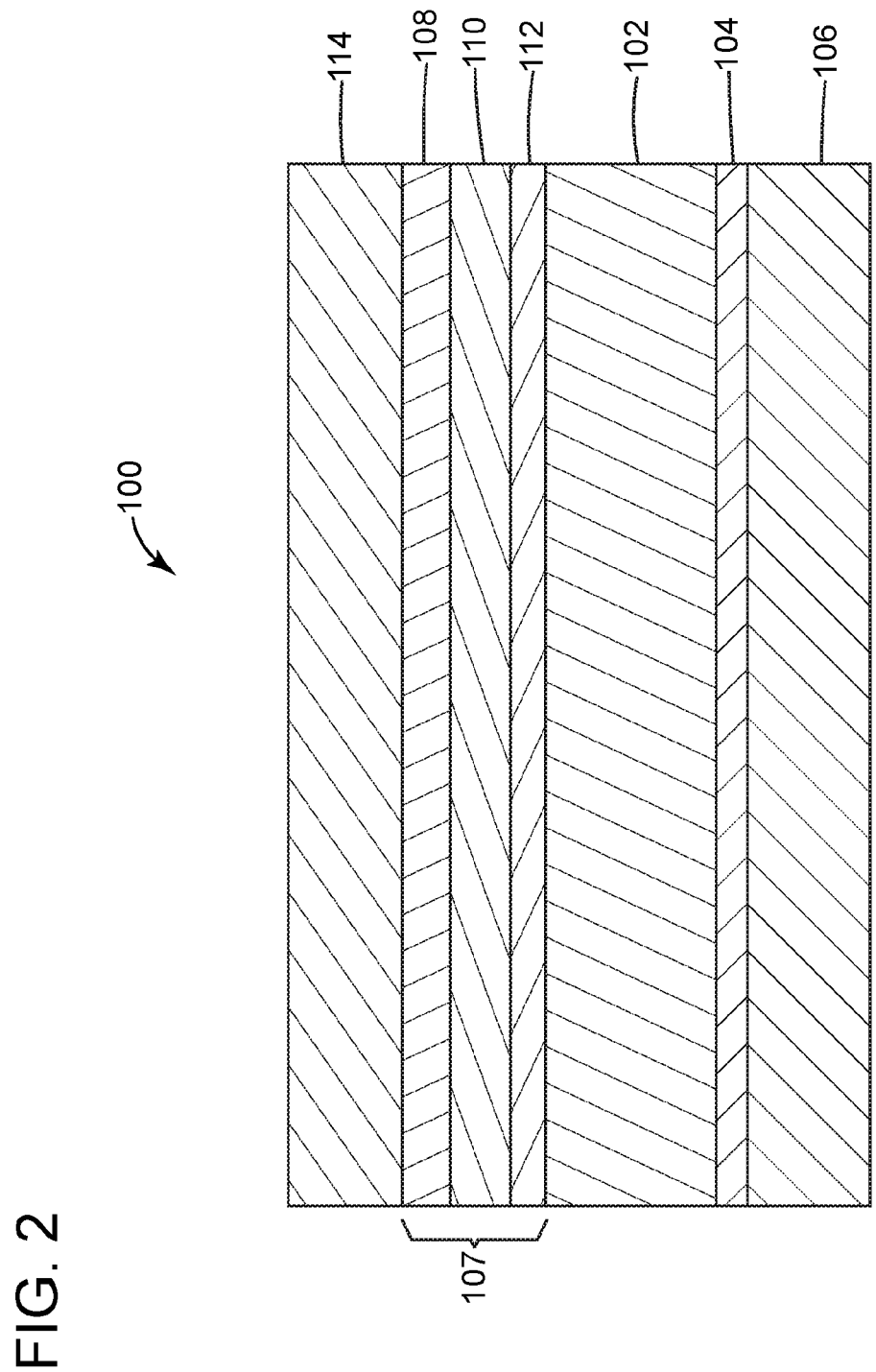
FIG. 2 is a simplified cross-sectional view of an exemplary embodiment of a semiconductor structure of an integrated circuit at an intermediate stage of manufacture, wherein the structure includes a mandrel layer disposed over a hardmask stack and the hardmask stack disposed over a dielectric layer in accordance with the present invention.

Referring to FIG. 2, a simplified cross-sectional view of an exemplary embodiment of a semiconductor structure 100 of an integrated circuit at an intermediate stage of manufacture in accordance with the present invention is presented. Structure 100 includes a dielectric layer 102 composed of a dielectric isolation material such as a low K or ultra-low K (ULK) material or various combinations of silicon, carbon, oxygen and hydrogen (an SiCOH layer). The dielectric layer 102 may be disposed over an etch-stop hard mask layer 104, such as a silicon nitride (SiN) or similar. The etch stop layer 104 may be disposed over a complex stack of buried layers 106 from the substrate (not shown) upwards.

Disposed respectively over the dielectric layer 102 is a hardmask stack 107. The hardmask stack includes at least one hardmask layer, but can include any number of hardmask layers depending upon engineering requirements. In this exemplary embodiment, the hardmask stack 107 includes a 1st hardmask layer 108 composed of silicon nitride (SiN) or similar material, a 2nd hardmask layer 110 composed of a titanium nitride (TiN) or similar material and a 3rd hardmask layer 112 also composed of a SiN or similar material. Disposed over the 1st hardmask layer 108 is a 1st mandrel layer 114 composed of silicon material, such an amorphous silicon (aSi), a polycrystalline silicon or similar.

Figure 3:
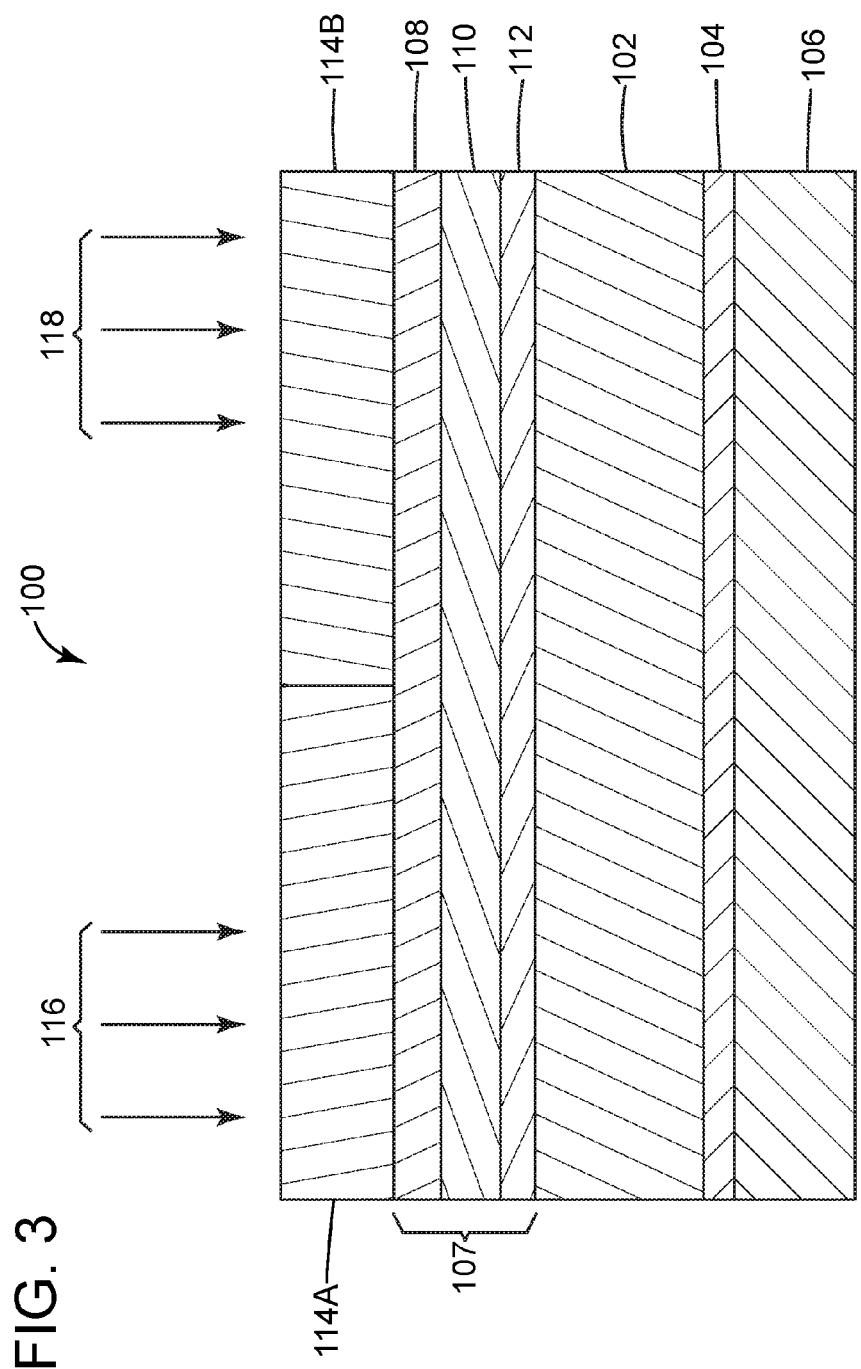
FIG. 3 is cross-sectional view of the structure of FIG. 2 after a 1st portion of the mandrel layer has been implanted with a 1st concentration of dopant and a 2nd portion of the mandrel layer has been implanted with a 2nd concentration of dopant in accordance with the present invention.

Referring to FIG. 3, next in the process flow, a 1st portion 114A of mandrel layer 114 is implanted with a 1st concentration of dopant 116 and a 2nd different portion 114B of mandrel layer 114 is implanted with a 2nd concentration of dopant 118. In this case, the 1st concentration of dopant 116 is different than the 2nd concentration of dopant 118. The dopants are typically dopant ions of boron (B), phosphorous (P), arsenic (As), silicon (Si), boron difluoride (BF2), nitrogen (N), oxygen (O2), germanium (Ge), or similar.

Though the 1st and 2nd dopant concentrations 116, 118 can vary in the type of ions used, they are typically different concentrations of the same ion. In this particular exemplary embodiment, the dopant is a phosphorous ion. The dopants may be implanted into the mandrel layer 114 by such well-known processes as ion bombardment, diffusion or similar. The dopant concentrations can vary from, for example, 0 to 1E20 ions/cm2 (ions per centimeter squared) or greater. In the case of ion bombardment, the energy levels used during the ion bombardment can vary typically from 5 KeV to 200 KeV.

In a typical exemplary dopant implanting operation, a 1st block mask layer (not shown) can be disposed over portion 114B. The 1st block mask layer may be an organic planarization layer (OPL) composed of an amorphous silicon or an amorphous carbon and may be applied using spin-on techniques. The exposed portion 114A is then implanted with the desired concentration of dopant 116. Next the 1st block mask layer would be stripped from structure 100 as with a wet etching process or similar. Next 2nd block mask layer (not shown) can be disposed over the portion 114A, and the exposed portion 114B can be implanted with the desired concentration of dopant 118.

In this particular case, the higher concentration of phosphorous dopants is the 2nd dopant concentration 118, which is implanted into mandrel layer portion 114B. Therefore, the lower concentration of phosphorous dopant 116 is implanted into mandrel layer portion 114A. A typical high concentration of phosphorous dopant 118 would be in the range of 1E15 to 1E20 ions/cm2 and a typical low concentration of phosphorous dopants 116 would be in the range of 1E10 to 1E15 ions/cm2 or similar.

Alternatively, the portion 114A may not be doped at all, which would be the equivalent of a 0 ion/cm2 dopant concentration for the low dopant concentration 116. In that case, only one block mask may be used to protect the undoped 114A portion, while the exposed 114B portion is doped with the desired dopant concentration 118.

Figure 4:
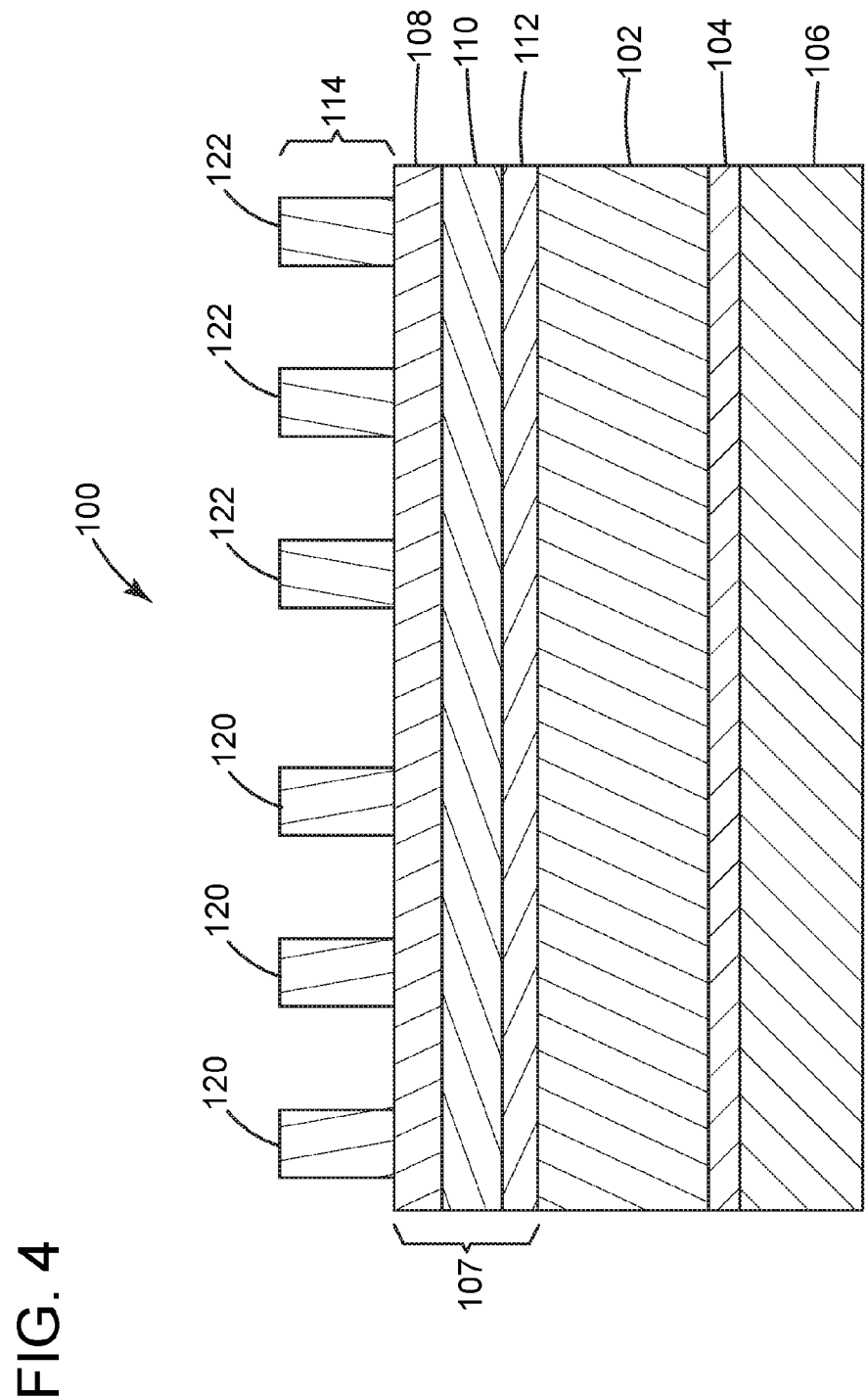
FIG. 4 is cross-sectional view of the structure of FIG. 3 after 1st mandrels have been patterned into the 1st portion of the mandrel layer and 2nd mandrels have been patterned into the 2nd portion of the mandrel layer in accordance with the present invention.

Referring to FIG. 4, next in the process flow, both 1st and 2nd sets of mandrels 120 and 122 are patterned into the mandrel layer 114 through well know lithographic processes. The 1st set of mandrels 120 have the low 1st dopant concentration 116 and the 2nd set of mandrels have the high 2nd dopant concentration 118. Since, both the 1st and 2nd mandrels 120, 122 are typically of equal width at this stage of the process flow, they can be patterned in the same set of lithographic steps.

Figure 5:
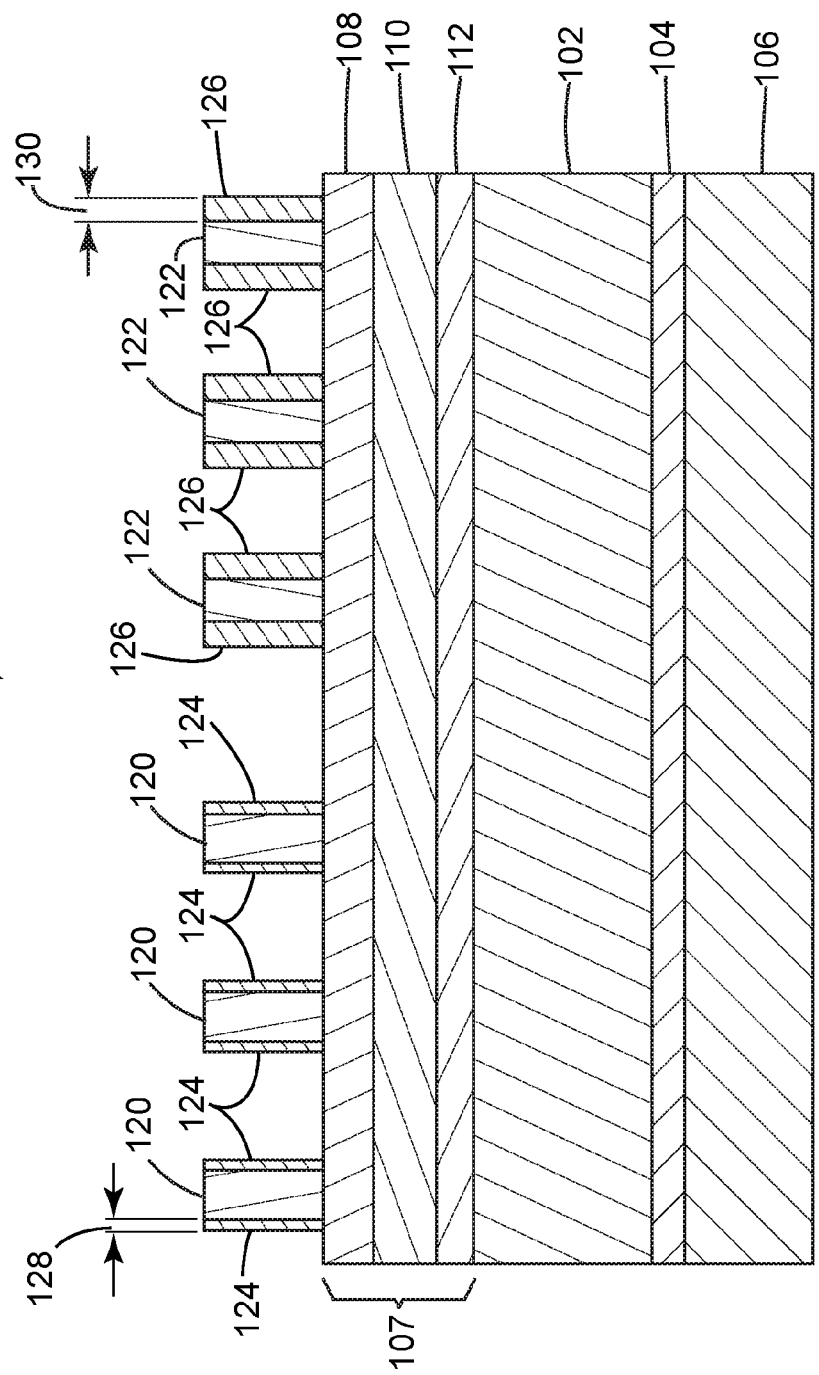
FIG. 5 is cross-sectional view of the structure of FIG. 4 after the 1st and 2nd mandrels have been thermally oxidized to form 1st and 2nd oxidized spacers on sidewalls of the 1st and 2nd mandrels respectively in accordance with the present invention.

Referring to FIG. 5, next in the process flow, rather than disposing a spacer layer and doing an anisotropic etch process to form self-aligned spacers (such as prior art spacers 20 and 24) on the sidewalls of the mandrels, the structure 100 is subjected to a thermal oxidation process to oxidize the silicon mandrels 120, 122. Because the doping concentrations 116, 118 are different, the oxidation rates of the silicon mandrels 120, 122 are also different. Basically, the mandrels 120 with the lower concentration of dopant 116 oxidize at a slower rate than the mandrels 122 with the higher concentration of dopant 118. Parameters, such as oxygen flow, water flow, temperature, time and pressure, of the thermal oxidation process can vary depending upon engineering requirements, but typically the oxidation process is done within a temperature range of from 150 degrees C. to 600 degree C.

The oxidation process forms a 1st oxidized spacer layer (not shown) over the 1st mandrels 120 and a 2nd oxidized spacer layer (not shown) over the 2nd mandrels 122. Both 1st and 2nd oxidation spacer layers are then anisotropically etched, as for example with a RIE process or similar. The anisotropic etch process forms a set of 1st oxidized spacers 124, which are self-aligned to the sidewalls of the 1st mandrels 120, and a set of 2nd oxidized spacers 126, which are self-aligned to the sidewalls of the 2nd mandrels 122.

Advantageously, due to the different oxidation rates of the different dopant concentrations 116, 118 in the 1st and 2nd mandrels 120, 122 respectively, the 1st oxidized spacers 124 will have a 1st spacer thickness 128 and the 2nd oxidized spacers 126 will have a 2nd spacer thickness 130, wherein the 1st and 2nd spacer thicknesses 128, 130 are different. More specifically, the 1st spacer thickness 128 will be thinner than 2nd spacer thickness 130 due to the fact that the oxidation rate of the 1st mandrels 120 with the lower dopant concentration 116 is slower than the oxidation rate of the 2nd mandrels 122 with the higher dopant concentration 118.

The oxidation rates can be precisely controlled such that the 1st and 2nd spacer thicknesses 128, 130 may also be precisely controlled (for example, within plus or minus 1 nm). Additionally, the range of the 1st and 2nd spacer thicknesses 128, 130 may be quite large (for example, from 1 nm to 50 nm thick).

Moreover, the difference in the oxidation rates may be controlled such that the difference, or variation, between the 1st and 2nd spacer thicknesses 128, 130 may be quite large or quite small. By way of example, the 2nd spacer thickness 130 may be controlled to be equal to or greater than one of 2, 5, and 10 times that of the 1st spacer thickness 128. By way of another example, the 1st spacer thickness 128 may be controlled to be smaller than the 2nd spacer thickness 130 within at least one of the ranges of 1 nm to 5 nm, 5nm to 10 nm and 10 nm to 50 nm Even though this exemplary embodiment only illustrates two different dopant concentrations 116, 118 used to form two different thickness oxidized spacers 124, 126, one skilled in the art would recognize that any number of dopant concentrations can be used to generate any number of variable thickness oxidizes spacers. For example, a zero dopant concentration, a low dopant concentration and a high dopant concentration may be used to generate three different thicknesses for three different oxidized spacers from the same mandrel layer 114.

Referring to FIG. 6, next in the process flow, the mandrels 120, 122 are pulled from the structure 100. This can be accomplished by a wet etching process or similar. The remaining spacers 124, 126, now form a metal line pattern 132 that will be used to pattern the mandrel 138, 142 and non-mandrel 140, 144 metal lines into the dielectric layer 102 (best seen in FIG. 8).

The 1st and 2nd oxidized spacers 124, 126 of the pattern 132 function as masks that will form dielectric filled spaces between the mandrel 138, 142 and non-mandrel 140, 144 metal lines within the dielectric layer 18. The exposed mandrel regions 129 of pattern 132, which are located over the portions of the second hardmask layer 17 where the 1st and 2nd mandrels 120, 122 were disposed, function as mandrel line molds in the formation of the mandrel metal lines 138, 142 within the dielectric layer 18. The exposed non-mandrel regions 131 of the pattern 132, which are located over the portions of the second hardmask layer 17 that were not covered by either the 1st and 2nd mandrels 120, 122 or the 1st and 2nd oxidized spacers 124, 126, function as non-mandrel line molds in the formation of the non-mandrel metal lines 140, 144 within the dielectric layer 18.

Referring to FIG. 7, the pattern 132 is next anisotropically etched to transfer the pattern down into the dielectric layer 102. This may be accomplished by selectively anisotropically etching, such as in a RIE process or similar, the pattern 132 to transfer it through the SiN 1st hardmask layer 108, the TiN 2nd hardmask layer 110 and the SiN 3rd hardmask layer 112. After transferring through the 1st, 2nd, and 3rd, hardmask layers 108, 110, 112, the etching process is continued to form trenches 134 in the dielectric layer 102.

The etching process can be done in several RIE process steps. Alternatively, the RIE process can be accomplished in a single continuous RIE process wherein the chemically reactive plasma used to remove material is continuously changed to be selective with the material of the layer it is etching.

Referring to FIG. 8, next in the process flow, the structure 100 is covered with a metal layer 136 to fill the trenches 134. The metal layer 136 is then planarized down to complete the formation of a set of 1st mandrel metal lines 138 and 1st non-mandrel metal lines 140. Additionally, the planarized metal layer 136 completes the formation of a set of 2nd mandrel metal lines 142 and non-mandrel metal lines 144. In this particular embodiment, a non-mandrel metal line 146 is also disposed in the region separating the array of 1st mandrel and non-mandrel metal lines 138, 140 and the array of 2nd mandrel and non-mandrel metal lines 142, 144. The planarization can be done by such well-known techniques as CMP or similar. The metal may be copper, tungsten or similar.

The 1st mandrel metal lines 138 have a 1st mandrel metal line thickness (or width) 148. The 1st non-mandrel metal lines 140 have a 1st non-mandrel metal line thickness (or width) 150. The 2nd mandrel metal lines 142 have a 2nd mandrel metal line thickness (or width) 152. The 2nd non-mandrel metal lines 144 have a 2nd non-mandrel metal line thickness (or width) 154.

In this embodiment, for purposes of clarity, the 1st mandrel and 1st non-mandrel metal line thicknesses 148 and 150 are set substantially equal. Additionally, for purposes of clarity, the 2nd mandrel and 2nd non-mandrel metal line thicknesses 152 and 154 are also set substantially equal. However, one skilled in the art would recognize that the thicknesses 148, 150 of 1st mandrel and non-mandrel metal lines 138, 140 do not have to be equal. Further, one skilled in the art would also recognize that the thicknesses 152, 154 of the 2nd mandrel and non-mandrel metal lines 142, 144 do not have to be equal.

Advantageously however, largely due to the precisely controlled variations in the 1st and 2nd spacer thicknesses 128, 130 discussed earlier in FIG. 5, the 1st mandrel and 1st non-mandrel metal line thicknesses 148, 150 can be varied and precisely controlled from that of the 2nd mandrel and 2nd non-mandrel metal line thicknesses 152, 154. By way of example, the 1st mandrel and 1st non-mandrel metal line thicknesses 148, 150 may be controlled to be equal to or greater than one of 2, 5 and 10 times that of the 2nd mandrel and 2nd non-mandrel metal line thicknesses 152, 154. By way of another example, the 2nd mandrel and 2nd non-mandrel metal line thicknesses 152, 154 may be controlled to be smaller than the 1st mandrel and 1st non-mandrel metal line thicknesses 148, 150 within at least one of the ranges of 1 nm to 5 nm, 5 nm to 10 nm and 10 nm to 50 nm.

Accordingly, the method as just described offers a great deal of flexibility in forming variable metal lines in a semiconductor structure. Additionally, the variations can have a wide range, wherein a 1st metal line thickness can be many times larger than a 2nd metal line thickness within the same dielectric layer. Further, the variations can be on a very small scale, wherein the difference in thicknesses (or widths) of a 1st and a 2nd metal line can be 5 nm, 3 nm, 1 nm or less. Moreover the variable width metal lines may have widths (e.g., below 40 nm width or below 20 nm width) that are too small for a conventional lithographic process to resolve.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:
1. A method comprising:
   providing a semiconductor structure having a silicon mandrel layer and a hardmask stack disposed respectively over a dielectric layer;
   doping a $1^{st}$ portion of the mandrel layer with a $1^{st}$ concentration of dopant;

doping a $2^{nd}$ portion of the mandrel layer with a $2^{nd}$ concentration of dopant, the $2^{nd}$ concentration of dopant being greater than the $1^{st}$ concentration of dopant;

patterning $1^{st}$ mandrels into the $1^{st}$ portion of the mandrel layer;

patterning $2^{nd}$ mandrels into the $2^{nd}$ portion of the mandrel layer;

thermally oxidizing the $1^{st}$ and $2^{nd}$ mandrels in the same thermal oxidation process to form $1^{st}$ oxidation spacers on sidewalls of the $1^{st}$ mandrels and $2^{nd}$ oxidation spacers on sidewalls of the $2^{nd}$ mandrels, the $2^{nd}$ oxidation spacers having a thickness that is greater than a thickness of the $1^{st}$ oxidation spacers; and utilizing the $1^{st}$ and $2^{nd}$ oxidation spacers to form $1^{st}$ and $2^{nd}$ metal lines respectively in the dielectric layer, the $1^{st}$ metal lines having a thickness that is different than a thickness of the $2^{nd}$ metal lines.

2. The method of claim 1 comprising;
pulling the $1^{st}$ and $2^{nd}$ mandrels from the structure;
forming a metal line pattern from the remaining $1^{st}$ and $2^{nd}$ spacers;
etching the pattern through the hardmask stack and into the dielectric layer; and
forming trenches in the dielectric layer from the pattern.

3. The method of claim 2 comprising:
disposing a metal layer over the structure to fill the trenches; and
planarizing the metal layer to form the $1^{st}$ and $2^{nd}$ metal lines, wherein:
the $1^{st}$ metal lines include $1^{st}$ mandrel and $1^{st}$ non-mandrel metal lines, and
the $2^{nd}$ metal lines include $2^{nd}$ mandrel and $2^{nd}$ non-mandrel metal lines.

4. The method of claim 3 comprising:
the $1^{st}$ mandrel and $1^{st}$ non-mandrel metal lines being of equal thickness;
the $2^{nd}$ mandrel and $2^{nd}$ non-mandrel metal lines being of equal thickness; and
the $1^{st}$ metal lines having a thickness that is larger than a thickness of the $2^{nd}$ metal lines.

5. The method of claim 1 wherein the $1^{st}$ metal line thickness is equal to or greater than one of 2, 5, and 10 times that of the $2^{nd}$ metal line thickness.

6. The method of claim 1 wherein the $2^{nd}$ metal line thickness is smaller than the $1^{st}$ metal line thickness within at least one of the ranges of 1 nm to 5 nm, 5 nm to 10 nm and 10 nm to 50 nm.

7. The method of claim 1 wherein the $1^{st}$ and $2^{nd}$ metal lines having metal line widths that are within one of a range of less than 40 nm and less than 20 nm.

8. The method of claim 1 wherein the $1^{st}$ and $2^{nd}$ concentration of dopants are different concentrations of the same dopant ion.

9. The method of claim 1 wherein the $1^{st}$ concentration is a zero concentration of dopant.

10. The method of claim 1 wherein the $1^{st}$ and $2^{nd}$ concentration of dopants are both within a range of concentration of from 0 to 1E20 ions/cm$^2$.

11. The method of claim 10 comprising:
the $1^{st}$ dopant concentration being within a range of 1E10 to 1E15 ions/cm$^2$; and
the $2^{nd}$ dopant concentration being within a range of 1E15 to 1E20 ions/cm$^2$.

12. The method of claim 1 wherein the thermal oxidation process is within a temperature range of 150 degrees C. to 600 degrees C.

13. The method of claim 1 wherein the dopant ions used to implant the dopant concentrations are one of boron, phosphorous, arsenic, silicon, boron difluoride, nitrogen, oxygen and germanium.

14. A method comprising:
providing a semiconductor structure having a silicon mandrel layer and a hardmask stack disposed respectively over a dielectric layer;
doping a $1^{st}$ portion of the mandrel layer with a $1^{st}$ concentration of dopant;
doping a $2^{nd}$ portion of the mandrel layer with a $2^{nd}$ concentration of the same dopant, the $2^{nd}$ concentration of dopant being greater than the $1^{st}$ concentration of dopant;
patterning $1^{st}$ mandrels into the $1^{st}$ portion of the mandrel layer;
patterning $2^{nd}$ mandrels into the $2^{nd}$ portion of the mandrel layer;
thermally oxidizing the $1^{st}$ and $2^{nd}$ mandrels in the same thermal oxidation process to form $1^{st}$ oxidation spacers on sidewalls of the $1^{st}$ mandrels and $2^{nd}$ oxidation spacers on sidewalls of the $2^{nd}$ mandrels, the $2^{nd}$ oxidation spacers having a thickness that is greater than a thickness of the $1^{st}$ oxidation spacers; and
utilizing the $1^{st}$ and $2^{nd}$ oxidation spacers to form $1^{st}$ and $2^{nd}$ metal lines respectively in the dielectric layer, the $1^{st}$ metal lines having a thickness that is greater than a thickness of the $2^{nd}$ metal lines.

15. The method of claim 14 comprising;
pulling the $1^{st}$ and $2^{nd}$ mandrels from the structure;
forming a metal line pattern from the remaining $1^{st}$ and $2^{nd}$ spacers;
etching the pattern through the hardmask stack and into the dielectric layer;
forming trenches in the dielectric layer from the pattern;
disposing a metal layer over the structure to fill the trenches; and
planarizing the metal layer to form the $1^{st}$ and $2^{nd}$ metal lines, wherein:
the $1^{st}$ metal lines include $1^{st}$ mandrel and $1^{st}$ non-mandrel metal lines, and
the $2^{nd}$ metal lines include $2^{nd}$ mandrel and $2^{nd}$ non-mandrel metal lines.

16. The method of claim 15 comprising:
the $1^{st}$ mandrel and $1^{st}$ non-mandrel metal lines being of equal thickness; and
the $2^{nd}$ mandrel and $2^{nd}$ non-mandrel metal lines being of equal thickness.

17. The method of claim 14 wherein the $1^{st}$ metal line thickness is equal to or greater than one of 2, 5, and 10 times that of the $2^{nd}$ metal line thickness.

18. The method of claim 14 wherein the $2^{nd}$ metal line thickness is smaller than the $1^{st}$ metal line thickness within at least one of the ranges of 1 nm to 5 nm, 5 nm to 10 nm and 10 nm to 50 nm.

19. The method of claim 14 wherein the $1^{st}$ and $2^{nd}$ metal lines having metal line widths that are within one of a range of less than 40 nm and less than 20 nm.

20. The method of claim 14 wherein the $1^{st}$ and $2^{nd}$ concentration of dopants are both within a range of concentration of from 0 to 1E20 ions/cm$^2$.

* * * * *